(12) United States Patent
Shi et al.

(10) Patent No.: US 11,066,575 B2
(45) Date of Patent: Jul. 20, 2021

(54) CHEMICAL MECHANICAL PLANARIZATION FOR TUNGSTEN-CONTAINING SUBSTRATES

(71) Applicant: Versum Materials US, LLC, Tempe, AZ (US)

(72) Inventors: Xiaobo Shi, Chandler, AZ (US); Hongjun Zhou, Chandler, AZ (US); James Allen Schlueter, Phoenix, AZ (US); Jo-Ann T. Schwartz, Kennett Square, PA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/560,713

(22) Filed: Sep. 4, 2019

(65) Prior Publication Data

US 2020/0079976 A1   Mar. 12, 2020

Related U.S. Application Data

(60) Provisional application No. 62/727,749, filed on Sep. 6, 2018.

(51) Int. Cl.
| | | |
|---|---|---|
| *C09G 1/02* | (2006.01) | |
| *C09K 13/00* | (2006.01) | |
| *H01L 21/105* | (2006.01) | |
| *H01L 21/321* | (2006.01) | |
| *H01L 21/768* | (2006.01) | |
| *H01L 21/3105* | (2006.01) | |

(52) U.S. Cl.
CPC ............. *C09G 1/02* (2013.01); *C09K 13/00* (2013.01); *H01L 21/31053* (2013.01); *H01L 21/3212* (2013.01); *H01L 21/7684* (2013.01)

(58) Field of Classification Search
CPC ........ C09G 1/02; C09K 13/00; C09K 3/1463; H01L 21/7684; H01L 21/3212; H01L 21/31053
See application file for complete search history.

(56) References Cited

U.S. PATENT DOCUMENTS

| | | | | |
|---|---|---|---|---|
| 2006/0261306 A1* | 11/2006 | Li | .................. | C09K 3/1409 |
| | | | | 252/79.1 |
| 2014/0273458 A1* | 9/2014 | Shi | .................. | C09G 1/02 |
| | | | | 438/692 |

FOREIGN PATENT DOCUMENTS

JP        2006041252 A  *  2/2006

* cited by examiner

*Primary Examiner* — Nadine G Norton
*Assistant Examiner* — Mahmoud Dahimene
(74) *Attorney, Agent, or Firm* — Lina Yang

(57) ABSTRACT

Chemical mechanical polishing (CMP) compositions, systems and methods of using the compositions for polishing tungsten or tungsten-containing substrates. The compositions comprise nano-sized abrasive; metal compound coated organic polymer particles as solid state catalyst; oxidizer; tungsten corrosion inhibitor; and a water based liquid carrier.

20 Claims, 2 Drawing Sheets

CHEMICAL MECHANICAL PLANARIZATION FOR TUNGSTEN-CONTAINING SUBSTRATES

CROSS REFERENCE TO RELATED PATENT APPLICATIONS

This application claims the benefit of priority under 35 U.S.C. § 119(e) to earlier filed U.S. patent application Ser. Nos. 62/692,633, and 62/727,749 filed on Sep. 6, 2018, which are entirely incorporated herein by reference.

BACKGROUND OF THE INVENTION

This invention relates generally to the chemical-mechanical planarization (CMP) of tungsten (W)-containing substrates on semiconductor wafers.

This invention is specific to the application of using metal compound coated organic polymer particles, that is, organic polymer particle based metal oxide as solid state catalyst that afford desirable tungsten film removal rates, lowered dielectric film removal rates, increased selectivity in polishing W/Dielectric films, and reduced iron contamination level on the polished wafers.

There are a large number of materials used in the manufacture of integrated circuits such as a semiconductor wafer. The materials generally fall into three categories—dielectric material, adhesion and/or barrier layers, and conductive layers. The use of the various substrates, e.g., dielectric material such as tetraethyl orthosilicate, formally named tetraethoxysilane and abbreviated TEOS, plasma-enhanced TEOS (PETEOS), and low-k dielectric materials; barrier/adhesion layers such as tantalum, titanium, tantalum nitride, and titanium nitride; and conductive layers such as copper, aluminum, tungsten, and noble metals are known in the industry.

Integrated circuits are interconnected through the use of well-known multilevel interconnections. Interconnection structures normally have a first layer of metallization, an interconnection layer, a second level of metallization, and typically third and subsequent levels of metallization. Interlevel dielectric materials such as silicon dioxide and sometimes low-k materials are used to electrically isolate the different levels of metallization in a silicon substrate or well. The electrical connections between different interconnection levels are made through the use of metallized vias and in particular tungsten vias. U.S. Pat. No. 4,789,648 describes a method for preparing multiple metallized layers and metallized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to the dielectric material.

In one semiconductor manufacturing process, metallized vias or contacts are formed by a blanket tungsten deposition followed by a CMP step. In a typical process, via holes are etched through the interlevel dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess tungsten is removed by chemical mechanical polishing (CMP) to form metal vias.

Chemical mechanical planarization (CMP) for planarization of semiconductor substrates is now widely known to those skilled in the art and has been described in numerous patents and open literature publications.

In a typical CMP process, a substrate (e.g., a wafer) is placed in contact with a rotating polishing pad attached to a platen. A CMP composition, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The composition accomplishes the planarization (polishing) process by chemically and mechanically interacting with the substrate film being planarized due to the effect of the rotational movement of the pad parallel to the substrate. Polishing is continued in this manner until the desired film on the substrate is removed with the usual objective being to effectively planarize the substrate. Typically metal CMP compositions contain an abrasive material, such as silica or alumina, suspended in an oxidizing, aqueous medium.

The ratio of the removal rate of a metal (e.g., tungsten) to the removal rate of a dielectric base (e.g., TEOS) is called the "selectivity" for removal of the metal in relation to removal of the dielectric during CMP processing of substrates comprised of metal and dielectric material.

When CMP compositions with high selectivity for removal of metal in relation to dielectric are used, the metal layers are easily over-polished creating a depression or "dishing" effect in the metalized areas. This feature distortion is unacceptable due to lithographic and other constraints in semiconductor manufacturing.

Another feature distortion that is unsuitable for semiconductor manufacturing is called "erosion." Erosion is the topography difference between a field of dielectric and a dense array of metal vias or trenches. In CMP, the materials in the dense array may be removed or eroded at a faster rate than the surrounding field of dielectric. This causes a topography difference between the field of dielectric and the dense metal (e.g., copper or tungsten) array.

There are prior arts teaching the use of the colloidal silica particle based solid state catalyst.

U.S. Pat. No. 7,014,669 provides a composition for chemical-mechanical polishing which comprises at least one abrasive particle having a surface at least partially coated by a catalyst. The catalyst comprises a metal other than a metal of Group 4(b), Group 5(b) or Group 6(b). The composition further comprises at least one oxidizing agent. The composition is believed to be effective by virtue of the interaction between the catalyst coated on the surface of the abrasive particles and the oxidizing agent, at the catalyst surface. The invention further provides a method that employs the composition in the polishing of a feature or layer, such as a metal film, on a substrate surface. The invention additionally provides a substrate produced this method.

U.S. Pat. No. 7,427,305 relates to a method of making selected oxidizers or other free radical-producing compounds become more effective chemical etchants and/or oxidizers for CMP activities by promoting the formation of the free radicals in a CMP composition with one or more activators. The activator comprises iron, copper or combinations thereof. The activator coated abrasive is particularly effective as it brings the activator in close proximity to the targeted material on the substrate surface, and thus facilitates or accelerates the removal reaction substantially at the site of the targeted material. The activator reacts with the per-type oxidizer to form at least one oxygen-containing free radical.

The invention further provides a method that employs the composition in the polishing of a feature or layer, such as a metal film, on a substrate surface. The invention additionally provides a substrate produced by this method.

US20120028466 discloses method affording low dishing levels in the polished tungsten substrate while simultaneously affording high metal removal rates. The method utilizes an associated polishing composition. Components in the composition include a poly(alkyleneimine) such as polyethyleneimine, an abrasive, an acid, and an oxidizing agent, such as a per-compound.

The other related prior arts involved the use of various organic polymer particles as abrasives in the CMP polishing compositions.

US20020173243 discloses an aqueous polishing composition for chemical mechanical polishing to remove copper from a buffer material, the composition comprising, an oxidizing agent, a complexing agent, an inhibitor, a dishing reducing agent, and abrasive particles comprising organic polymer particles for clearing relatively soft copper from the buffer material by chemical mechanical polishing while minimizing dishing and avoiding removal of the buffer material.

US20040229461 discloses a CMP composition containing a rheology agent, e.g., in combination with oxidizing agent, chelating agent, inhibiting agent, abrasive and solvent. Such CMP composition advantageously increases the materials selectivity in the CMP process and is useful for polishing surfaces of copper elements on semiconductor substrates, without the occurrence of dishing or other adverse planarization deficiencies in the polished copper.

US20120322264 discloses an aqueous polishing agent, comprising, as the abrasive, at least one kind of polymer particles (A) finely dispersed in the aqueous phase and having at their surface a plurality of at least one kind of functional groups (al) capable of interacting with the metals and/or the metal oxides on top of the surfaces to be polished and forming complexes with the said metals and metal cations, the said polymer particles (A) can be prepared by the emulsion or suspension polymerization of at least one monomer containing at least one radically polymerizable double bond in the presence of at least one oligomer or polymer containing a plurality of functional groups (a1); graft copolymers can be prepared by the emulsion or suspension polymerization of at least one monomer containing at least one radically polymerizable double bond in the presence of at least one oligomeric or polymeric aminotriazine-polyamine condensate; and a process for the chemical and mechanical polishing of patterned and unstructured metal surfaces making use of the said aqueous polishing agent.

US20090053896 discloses a water-soluble polymer is effective as a removal rate enhancer in a chemical mechanical polishing composition to polish copper on semiconductor wafers or other copper laid structures, while keeping the etching rate low. The composition may also include soft particles and certain metal chelating agents, or combinations thereof. The composition can also comprise an abrasive particle, an organic acid, and an oxidizer.

As industry standards trend toward smaller device features, there is a continuous developing need for tungsten CMP compositions that deliver superior planarization of the nanostructures of IC chips. Specifically, for 28 nm technology nodes and beyond applications, composition products must deliver tunable removal rate and tunable selectivity between metal and dielectric, reduce the erosion and dishing while maintaining sufficient removal rate.

There is a significant need for tungsten CMP process(es) and composition(s) that provide tunable, effective polishing at desired polishing rates, controlled polishing selectivity of tungsten to other materials, such as dielectric materials, while provide low metal contamination level on the polished wafers, low static etching rates to minimize surface imperfections, defects, corrosion, and erosion of oxide in areas with tungsten vias.

BRIEF SUMMARY OF THE INVENTION

The tungsten CMP compositions, methods and systems described herein satisfy the need for tunable removal rates, high selectivity in polishing tungsten and dielectric films, and provides low metal contamination level.

In one aspect, the invention provides a tungsten chemical mechanical polishing (CMP) composition comprising:
a) nano-sized abrasive;
b) metal compound coated organic polymer particles as solid state catalyst;
c) oxidizer;
d) corrosion inhibitor;
e) water soluble liquid carrier; and
    optionally
f) biocide;
g) pH adjusting agent;
h) surfactant;
wherein pH of the CMP composition is from about 2.0 to about 12, preferably 2.5 to 8, and more preferably 3 to 6.

In another aspect, the invention provides a method of chemical mechanical polishing a semiconductor substrate having at least one surface comprising tungsten containing film, comprising
a) providing a polishing pad;
b) providing a chemical mechanical polishing composition comprising
    1) nano-sized abrasive;
    2) metal compound coated organic polymer particles as solid state catalyst;
    3) oxidizer;
    4) corrosion inhibitor;
    5) water soluble liquid carrier; and
        optionally;
    6) biocide;
    7) pH adjusting agent;
    8) surfactant;
    wherein pH of the CMP composition is from about 2.0 to about 12, preferably 2.5 to 8, and more preferably 3 to 6;
c) contacting the surface of the semiconductor substrate with the polishing pad and the chemical mechanical polishing composition; and
d) polishing the surface of the semiconductor substrate;
    wherein at least a portion of the surface containing tungsten is in contact with both the polishing pad and the chemical mechanical polishing composition.

In yet another aspect, the invention provides a method of a selective chemical mechanical polishing comprising steps of:
a) providing a semiconductor substrate having a surface containing tungsten and at least one dielectric material;
b) providing a polishing pad;
c) providing a chemical mechanical polishing (CMP) composition comprising
    1) nano-sized abrasive;
    2) metal compound coated organic polymer particles as solid state catalyst;

3) oxidizer;
4) corrosion inhibitor;
5) water soluble liquid carrier; and
   optionally
6) biocide;
7) pH adjusting agent;
8) surfactant;
wherein pH of the CMP composition is from about 2.0 to about 12, preferably 2.5 to 8, and more preferably 3 to 6;
d) contacting the surface of the semiconductor substrate with the polishing pad and the chemical mechanical polishing composition; and
e) polishing the surface of the semiconductor;
wherein ratio of removal rate of tungsten to removal rate of the at least one dielectric material is equal or greater than 50:1, preferably equal or greater than 90:1.

In yet another aspect, the invention provides a system of selective chemical mechanical polishing comprising:
   a) a semiconductor substrate having a surface containing tungsten and at least one dielectric material;
   b) a polishing pad;
   c) a chemical mechanical polishing (CMP) composition comprising
      1) nano-sized abrasive;
      2) metal compound coated organic polymer particles as solid state catalyst
      3) oxidizer;
      4) corrosion inhibitor;
      5) water soluble liquid carrier; and optionally
      6) biocide;
      7) pH adjusting agent;
      8) surfactant;
      wherein pH of the CMP composition is from about 2.0 to about 12, preferably 2.5 to 8, and more preferably 3 to 6;
wherein at least a portion of the surface containing tungsten is in contact with both the polishing pad and the chemical mechanical polishing composition.

The nano-sized abrasive refers to the abrasive having particle size ranging from 1 nm to 1,000 nm; includes but is not limited to colloidal silica; colloidal aluminum oxide including alpha-, beta-, and gamma-types of aluminum oxides; colloidal and photoactive titanium dioxide; cerium oxide; colloidal cerium oxide; nano-sized diamond particles; nano-sized silicon nitride particles; mono-modal, bi-modal, multi-modal colloidal abrasive particles; zirconium oxide; organic polymer-based soft abrasives; and combinations thereof.

The concentration of the nano-sized abrasive in the tungsten CMP polishing compositions is from 0.05 wt. % to 10.0 wt. %, preferably from 0.1 wt. % to 5.0 wt. %, and more preferably from 0.5 wt. % to 2.00 wt. %.

The metal compound coated organic polymer particles as solid state catalysts are organic polymer particle based solid state catalysts. The metal compounds include but are not limited to iron compounds, copper compounds, silver compound, cobalt compounds, nickel compounds, and combinations thereof. The preferred metal compounds are iron compounds. The organic polymer particles include but are not limited to the beads of organic polystyrene sulfonate (PS—$SO_3H$) beads, organic polystyrene carboxylate (PS—COOH) beads, and organic polystyrene phosphate (PS—$PO_4^-$) beads.

The concentration of the metal compound coated organic polymer particles as solid state catalysts is from 0.01 wt. % to 2.0 wt. %, preferably from 0.05 wt. % to 1.0 wt. %, and more preferably from 0.25 wt. % to 0.75 wt. %.

The oxidizer for the tungsten CMP compositions includes, but is not limited to, the following: periodic acid, hydrogen peroxide, potassium iodate, potassium permanganate, ammonium persulfate, ammonium molybdate, ferric nitrate, nitric acid, potassium nitrate, and combinations thereof.

The preferred oxidizer is hydrogen peroxide.

The tungsten CMP composition of this invention preferably contains 0.1 wt. % to 10 wt. %; the preferably from 0.5 wt. % to 5.0 wt. %, and more preferably from 1.0 wt. % to 3 wt. % of oxidizer.

The corrosion inhibitor for the tungsten CMP composition includes, but is not limited to, piperazine and its derivatives, linear or branched polyethylemine, organic polymeric or oligomeric primary and secondary amines, and combinations thereof. The preferred corrosion inhibitor is polyethylemine.

The tungsten CMP polishing compositions contains from 0.00001 wt. % to 0.20 wt. %, preferably from 0.00005 wt. % to 0.10 wt. %, and more preferably from 0.0001 wt. % to 0.05 wt. % of the corrosion inhibitor.

The water soluble liquid carrier includes but is not limited to deionized (DI) water, distilled water, and alcoholic organic water based solvents.

The preferred liquid carrier is DI water.

An acidic or basic pH adjusting agent can be used to adjust the tungsten CMP polishing compositions to the optimized pH value.

The pH adjusting agents include, but are not limited to nitric acid, hydrochloric acid, sulfuric acid, phosphoric acid, other inorganic or organic acids, and mixtures thereof for acidic pH conditions.

pH adjusting agents also include the basic pH adjusting agents, such as sodium hydride, potassium hydroxide, ammonium hydroxide, tetraalkyl ammonium hydroxide, organic quaternary ammonium hydroxide compounds, organic amines, and other chemical reagents that can be used to adjust pH towards the more alkaline direction.

The tungsten CMP compositions contain 0 wt. % to 1 wt. %; preferably 0.01 wt. % to 0.5 wt. %; more preferably 0.05 wt. % to 0.25 wt. % of a pH adjusting agent.

A biocide is used in the tungsten CMP polishing composition when pH of the polishing composition is between 5.0 to 8.0.

The biocide includes, but is not limited to, Kathon™, Kathon™ CG/ICP II, from Dupont/Dow Chemical Co. Bioban from Dupont/Dow Chemical Co. They have active ingredients of 5-chloro-2-methyl-4-isothiazolin-3-one and 2-methyl-4-isothiazolin-3-one.

The tungsten CMP compositions may contain biocide ranging from 0.0001 wt. % to 0.05 wt. %; preferably from 0.0005 wt. % to 0.025 wt. %, and more preferably from 0.001 wt. % to 0.01 wt. %.

The surfactant can be non-ionic, anionic, cationic, or amphoteric surfactants.

The surfactant generally is present in the tungsten CMP compositions in an amount ranging from about 0.001 wt. % to about 0.2 wt. % by weight, and preferably from about 0.001 wt. % to about 0.1 wt. %.

DETAILED DESCRIPTION OF THE INVENTION

Figure 1:
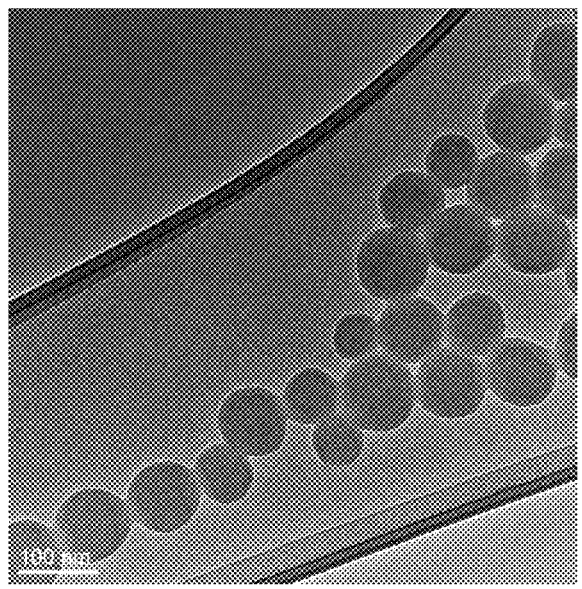
FIG. 1 The Transmission Electron Microscopy (TEM) image of un-coated latex particles.

As industry standards trend toward smaller device features, there is a continuous developing need for tungsten CMP compositions that deliver superior planarization of the nanostructures of IC chips. Specifically, for 28 nm technology nodes and beyond applications, CMP composition products must deliver suitable removal rate and tunable selectivity between metal and dielectric films, and reduce the erosion and dishing while maintaining sufficient removal rate.

The tungsten CMP compositions disclosed herein meet the need by using solid catalyst of iron compounds coated on colloidal organic polymer particle surfaces.

The tungsten chemical mechanical polishing (CMP) composition comprises:
a) nano-sized abrasive;
b) metal compound coated organic polymer particles as solid state catalyst;
c) oxidizer;
d) corrosion inhibitor;
e) water soluble liquid carrier; and
optionally
f) biocide;
g) pH adjuster;

wherein pH of the CMP composition is from about 2.0 to about 12, preferably 2.5 to 8, and more preferably 3 to 6.

The metal compound coated organic polymer particles as solid state catalysts are organic polymer particle based solid state catalysts. The metal compounds include but are not limited to iron compound, copper compound, silver compound, cobalt compound, nickel compound, and combinations thereof. The preferred metal compounds are iron compounds. The organic polymer particles include but are not limited to the beads of organic polystyrene sulfonate ($PS-SO_3H$) beads, organic polystyrene carboxylate (PS—COOH) beads, and organic polystyrene phosphate ($PS-PO_4^-$) beads.

The tungsten chemical mechanical polishing compositions use the metal compound coated organic polymer particles as solid state catalyst afford the desirable tungsten film removal rates, lowered dielectric film removal rates, reduced metal ion contaminations on the polished wafer surfaces, and increased selectivity in polishing W/Dielectric films.

The metal compound coated organic polymer particles as solid state catalyst used in the disclosed tungsten CMP polishing compositions includes the ferric oxide coated onto organic polystyrene particles with sulfonic acid or carboxylic acid as surface functional groups. These two functional groups forms complexes with ferric oxide compounds to yield stable solid catalysts when used in the tungsten chemical mechanical polishing compositions.

Organic polymer particles are considered soft particles while comparing to inorganic particles, such as silica, alumina, ceria and others.

Such soft organic polymer particles, when used as abrasives in CMP polishing compositions, may not be able to provide the same or similar abrasion forces as those inorganic particles afford.

However, instead of simply using organic polymer particles as abrasives in the CMP polishing compositions, the organic polymer particles are used as template to have organic polymer particles based solid state catalyst, that is, metal compounds coated on the surfaces of the organic polymer particles as the solid state catalyst.

The organic polymer particles used in this invention are polymer beads of such as organic polystyrene sulfonate ($PS-SO_3H$) beads, organic polystyrene carboxylate (PS—COOH) beads, and organic polystyrene phosphate ($PS-PO_4^-$) beads. The beads have sulfonic acid or carboxylic acid or phosphoric acid as surface functional groups.

The existence of these surface functional groups on the organic polymer particles allows the coating of metal compounds such as metal oxide, e.g., ferric oxide or other ferric compounds onto the latex surface of the organic polymer particles and thus forms the soft solid state catalyst used in the tungsten CMP polishing compositions.

The coating is through coordination bonding of metal oxide or other metal compounds to the sulfonic acid or carboxylic acid functional groups on the organic latex particle surfaces.

The coating process is described as following.

Under the stirring condition, organic latex particles with suitable surface functional groups such as sulfonic acid or carboxylic acid functional groups were added into deionized wafer. Ferric sulfate compound was slowly added into the solution containing latex particles. After stirring for 15 minutes, the selected resin(such as Purofine® PFA400, a strong base anion gel was supplied by Purolite Company located at 150 Monument Rd. Bala Cynwyd, Pa., USA 19004.) was added into the solution and the color of the solution became brownish. Then, the resin was removed through filtration, and the filtered solution was further heated to complete the coating process and obtained the organic latex polymer supported iron catalyst through chemical bonding.

The coated iron concentration was analyzed by Inductively Coupled Plasma Mass Spectroscopy (ICP-MS) spectroscopy. The iron concentration on the coated organic latex particle surface was ranged from 300 ppm to 360 ppm.

Figure 2:
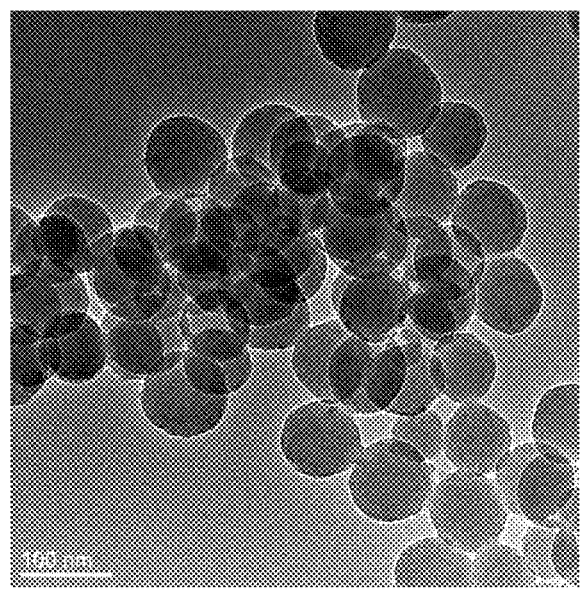
FIG. 2 The Transmission Electron Microscopy (TEM) image of iron-compound-coated latex particles.

The Transmission Electron Microscopy (TEM) image analysis results confirmed the surface coating of iron compounds on organic latex particles as shown in FIGS. 1 and 2.

The tungsten CMP polishing compositions using the organic polymer based or supported ferric oxide, i.e., iron compound coated organic polymer particles as solid state catalyst provide several benefits.

Firstly, the ferric oxide is coordinately bonded onto the organic polymer particle surfaces with either sulfonic acid group or carboxylic acid group. The solid state catalyst built on the soft organic polymer particle surface acts effectively as catalyst in the tungsten CMP compositions.

Secondly, such metal compound coated organic polymer particles as solid state catalyst affords the desirable tungsten film removal rates when used together with other types of abrasives, such as colloidal silica. The similar tungsten film removal rates are achieved when the same weight percentage of the metal compound coated organic polymer particles as solid state catalyst is used in the polishing composition vs. the same weight percentage of the solid state catalyst built on the surface of colloidal silica particles.

Thirdly, the use of the metal compound coated organic polymer particles as solid state catalyst leads to the reduced dielectric film removal rates while comparing with the colloidal silica particle based solid state catalyst. Therefore, the selectivity in polishing W/Dielectric films is increased.

Fourthly, the use of the metal compound coated organic polymer particles as solid state catalyst in the tungsten polishing composition also leads to the reduced iron contamination levels on the polished tungsten substrates.

Thus, the disclosed tungsten chemical mechanical polishing compositions using the metal compound coated organic polymer particles as solid state catalyst will provide better performances to meet the needs in semiconductor industry.

The concentration of the metal compound coated organic polymer particles as solid state catalyst is from 0.01 wt. % to 2.0 wt. %, preferably from 0.05 wt. % to 1.0 wt. %, and more preferably from 0.25 wt. % to 0.75 wt. %.

Nano-sized abrasive refers to the abrasive having particle size ranging from 1 nm to 1,000 nm. The nano-sized abrasive particles used for the tungsten CMP polishing compositions include, but are not limited to, the following: colloidal silica with narrow or broad particle size distributions, with various sizes and with various shapes, the various shapes of the abrasives include spherical shape, cocoon shape, aggregate shape and other shapes, the colloidal silica particles doped by other metal oxide within lattice of the colloidal silica, such as alumina doped silica particles, colloidal aluminum oxide, which include alpha-, beta-, and gamma-types of aluminum oxides, colloidal and photoactive titanium dioxide, cerium oxide, colloidal cerium oxide, nano-sized diamond particles, nano-sized silicon nitride particles, mono-modal, bi-modal, multi-modal colloidal abrasive particles, zirconium oxide, organic polymer-based soft abrasives, and combinations thereof.

In some embodiments, the nano-sized abrasive may comprises particles (such as colloidal silica particles) with different particle sizes for improving the removal rates.

The concentration of the nano-sized abrasive in the tungsten CMP polishing compositions is from 0.05 wt. % to 10.0 wt. %, preferably from 0.1 wt. % to 5.0 wt. %, and more preferably from 0.5 wt. % to 2.00 wt. %.

The oxidizer for the tungsten CMP compositions includes, but is not limited to, the following: periodic acid, hydrogen peroxide, potassium iodate, potassium permanganate, ammonium persulfate, ammonium molybdate, ferric nitrate, nitric acid, potassium nitrate, and combinations thereof.

The preferred oxidizer is hydrogen peroxide.

The tungsten CMP composition of this invention preferably contains 0.1 wt. % to 10 wt. %; the preferably from 0.5 wt. % to 5.0 wt. %, and more preferably from 1.0 wt. % to 3 wt. % of oxidizer.

The corrosion inhibitor for the tungsten CMP composition includes, but is not limited to, piperazine and its derivatives, linear or branched polyethylemine, other organic polymeric or oligomeric primary and secondary amines, and combinations thereof. The preferred corrosion inhibitor is polyethylemine.

The tungsten CMP polishing compositions contains from 0.00001 wt. % to 0.25 wt. %, preferably from 0.00005 wt. % to 0.10 wt. %, and more preferably from 0.0001 wt. % to 0.05 wt. % of corrosion inhibitor.

The water soluble liquid carrier includes but is not limited to deionized (DI) water, distilled water, and alcoholic organic water based solvents.

The preferred liquid carrier is DI water.

An acidic or basic pH adjusting agent can be used to adjust the tungsten CMP polishing compositions to the optimized pH value.

The pH adjusting agents include, but are not limited to nitric acid, hydrochloric acid, sulfuric acid, phosphoric acid, other inorganic or organic acids, and mixtures thereof.

pH adjusting agents also include the basic pH adjusting agents, such as sodium hydride, potassium hydroxide, ammonium hydroxide, tetraalkyl ammonium hydroxide, organic quaternary ammonium hydroxide compounds, organic amines, and other chemical reagents that can be used to adjust pH towards the more alkaline direction.

The tungsten CMP compositions contain 0 wt. % to 1 wt. %; preferably 0.01 wt. % to 0.5 wt. %; more preferably 0.05 wt. % to 0.25 wt. % of a pH adjusting agent.

A biocide is used in the tungsten CMP polishing composition when pH of the polishing composition is between 5.0 to 8.0.

The biocide includes, but is not limited to, Kathon™, Kathon™ CG/ICP II, from Dupont/Dow Chemical Co. Bioban from Dupont/Dow Chemical Co. They have active ingredients of 5-chloro-2-methyl-4-isothiazolin-3-one and 2-methyl-4-isothiazolin-3-one.

The tungsten CMP compositions may contain biocide ranging from 0.0001 wt. % to 0.1 wt. %; preferably from 0.0005 wt. % to 0.05 wt. %, and more preferably from 0.001 wt. % to 0.01 wt. %.

The surfactant can be non-ionic, anionic, cationic, or amphoteric surfactants.

More specifically, the surfactants used for the disclosed tungsten CMP compositions include, but are not limited to the following (a). Non-ionic surface wetting agents These agents typically are oxygen- or nitrogen-containing compounds with various hydrophobic and hydrophilic moieties in the same molecules, the molecular weight ranges from several hundreds to over 1 million. The viscosities of these materials also possess a very broad distribution.

(b). Anionic surface wetting agents

These compounds possess the negative net charge on major part of molecular frame, these compound include, but not limited to the following salts with suitable hydrophobic tails, such as alkyl carboxylate, alkyl sulfate, alkyl phosphate, alkyl bicarboxylate, alkyl bisulfate, alkyl biphosphate, such as alkoxy carboxylate, alkoxy sulfate, alkoxy phosphate, alkoxy bicarboxylate, alkoxy bisulfate, alkoxy biphosphate, such as substituted aryl carboxylate, substituted aryl sulfate, substituted aryl phosphate, substituted aryl bicarboxylate, substituted aryl bisulfate, substituted aryl biphosphate etc. The counter ions for this type of surface wetting agents include, but not limited to the following ions, such as potassium, ammonium and other positive ions. The molecular weights of these anionic surface wetting agents range from several hundred to several hundred-thousands.

(c). Cationic surface wetting agents

These compounds possess the positive net charge on major part of molecular frame, these compound include, but not limited to the following salts with suitable hydrophilic tails, such as carboxylate, sulfate, phosphate, bicarboxylate, bisulfate, biphosphate, etc. The counter ions for this type of surface wetting agents include, but not limited to the following ions, such as potassium, ammonium and other positive ions. The molecular weights of these anionic surface wetting agents range from several hundred to several hundred-thousands.

(d). Ampholytic surface wetting agents

These compounds possess both of positive and negative charges on the main molecular chains and with their relative counter ions. The examples of such bipolar surface wetting agents include, but not limited to the salts of amino-carboxylic acids, amino-phosphoric acid, and amino-sulfonic acid.

The surfactants used in the tungsten CMP compositions ranging from 0.0001% to 0.50%; preferably ranging from 0.0005% to 0.10%, more preferably 0.001 to about 0.1 weight percent.

The present invention is further demonstrated by the examples below.

WORKING EXAMPLE

The associated processes described herein entail use of the aforementioned composition for chemical mechanical planarization of substrates comprised of tungsten.

In the processes, a substrate (e.g., a wafer with W surface) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (composition) is applied (usually continuously) on the pad during CMP processing to effect the removal of material to planarize the substrate.

The polishing composition and associated processes described herein are effective for CMP of a wide variety of substrates, including most of substrates having, particularly useful for polishing tungsten substrates.

Parameters

All percentages are weight percentages unless otherwise indicated.
Å: angstrom(s)—a unit of length
W: tungsten
BP: back pressure, in psi units
CMP: chemical mechanical planarization=chemical mechanical polishing
CS: carrier speed
DF: Down force: pressure applied during CMP, unit psi
min: minute(s)
ml: milliliter(s)
mV: millivolt(s)
psi: pounds per square inch
PS: platen rotational speed of polishing tool, in rpm (revolution(s) per minute)
SF: polishing composition flow, ml/min
Wt. %: weight percentage (of a listed component)
TEOS: Tetraethyl orthosilicate, formally named tetraethoxysilane and abbreviated TEOS
NU % (or WIWNU %): With-In Wafer Non-Uniformity %
NU %=(|W film thickness pre-polishing−W film thickness post-polishing|/mean of total W film thickness)×100%
W RR 3.0 psi: Measured tungsten removal rate at 3.0 psi down pressure of the CMP tool
TEOS RR 3.0 psi: Measured TEOS removal rate at 3.0 psi down pressure of the CMP tool
W: TEOS Selectivity: (removal rate of W)/(removal rate of TEOS) at same down force (3.0 psi)

General Experimental Procedure

In the examples presented below, CMP experiments were run using the procedures and experimental conditions given below.

The CMP tool that was used in the examples is a Mirra®, manufactured by Applied Materials, 3050 Boweres Avenue, Santa Clara, Calif., 95054. An IC-1000 pad, supplied by Dow Chemicals, was used on the platen for the blanket wafer polishing studies. Pads were broken-in by polishing twenty-five dummy oxide (deposited by plasma enhanced CVD from a TEOS precursor, PETEOS) wafers.

In order to qualify the tool settings and the pad break-in, two PETEOS monitors were polished with Syton® OX-K colloidal silica, supplied by Planarization Platform of Air Products Chemicals Inc. at baseline conditions. Polishing experiments were conducted using blanket W wafer with 8K Angstroms in thickness, and TEOS wafer. These blanket wafers were purchased from Silicon Valley Microelectronics, 1150 Campbell Ave, Calif., 95126.

Surface functionized and nano-sized polystyrene particle solutions were supplied by Alpha Nanotech Inc. at 701 Harrison Ave., Blained Wash. 98320. Ferric(III) sulfate hydrate and polyethyleneimine were supplied by MilliporeSigma at 3050 Spruce St. St. Louis, Mo. 63103.

Different sized colloidal silica particles were supplied by JGC Corporation in Japan located 2-3-1, Minato Mirai, Nishi-ku, Yokohama 220-6001, Japan The experimental conditions were specified below: 3.0 psi down force and 120 rpm Table Seed/123 rpm Head Speed were applied with composition flow rate at 120 mL/min. and with ex-situ conditioning time at 10 second.

Example 1

The reference W CMP composition comprised of 0.4070 wt. % colloidal silica particle based solid state iron compound as catalyst; 0.00037 wt. % polyethyleneimine as W corrosion inhibitor; the abrasive comprised two parts: 0.1852 wt. % of 50 nm sized (measured by Dynamic light scattering (DLS) technology) colloidal silica particles as abrasive 1, 0.3086 wt. % of 160 nm colloidal silica particles as abrasive 2; and 3.0% $H_2O_2$ as oxidizing agent. The remaining was DI water.

The reference W CMP polishing composition had a pH at 3.4.

The disclosed working W CMP compositions used the organic polymer particle based solid state iron compound catalyst to replace the colloidal silica particle based solid state iron compound catalyst. Other parts remanded the same as in the reference composition.

More specifically, the working W CMP compositions used organic polystyrene sulfonate (PS—$SO_3H$) as based iron compound (I or II) or organic polystyrene carboxylate (PS—COOH) based iron compound (I or II) as the solid catalysts.

The working W CMP compositions had pH at 3.4.

The polishing tests were conducted to compare the performance from the compositions with the same concentrations of the organic polymer particles based solid state catalyst with the colloidal silica based solid state catalyst.

The results were listed in Table 1.

TABLE 1

W CMP Composition Performance Comparison - Organic Polymer Based Solid State Catalyst vs. Colloidal Silica Based solid state Catalyst

| Composition | W RR (Å/min) | NU % | TEOS RR | W:TEOS Selectivity | W RR % Change |
|---|---|---|---|---|---|
| Reference composition colloidal silica based solid state catalyst | 4427 | 6.16 | 278 | 16 | |
| Working composition PS—$SO_3H$ | 4772 | 6.85 | 50 | 95 | 7.8%(+) |

TABLE 1-continued

W CMP Composition Performance Comparison - Organic Polymer Based Solid State Catalyst vs. Colloidal Silica Based solid state Catalyst

| Composition | W RR (Å/min) | NU % | TEOS RR | W:TEOS Selectivity | W RR % Change |
|---|---|---|---|---|---|
| based solid state catalyst (I) | | | | | |
| Working composition PS—SO$_3$H based solid state catalyst (II) | 4807 | 7.28 | 72 | 67 | 8.6%(+) |
| Working composition PS—COOH based solid state catalyst (I) | 4692 | 6.15 | 86 | 55 | 6.0%(+) |
| Working composition PS—COOH based solid state catalyst (II) | 4428 | 5.88 | 64 | 69 | No change |

As the results shown in Table 1, the tungsten CMP polishing compositions that contain the solid state iron catalyst whether coated on PS—SO$_3$H or PS—COOH organic polymer particle surfaces gave same or higher removal rates as the tungsten CMP composition that contain the solid iron catalyst coated on colloidal silica particle surfaces.

The W CMP polishing compositions containing PS—SO$_3$H based solid state catalyst (I or II) gave about 8% increase in W film removal rates than the W film removal rates obtained using W Composition containing colloidal silica based solid state catalyst.

The W CMP polishing compositions containing PS—COOH based solid state catalyst (I or II) gave about 6% increase or no change respectively on W film removal rates than the W film removal rates obtained using W Composition containing colloidal silica based solid state catalyst.

The W polishing compositions containing either PS—SO$_3$H based solid state catalyst (I or II) or PS—COOH based solid state catalyst (I or II) gave much higher selectivity in polishing W/Dielectric films than the selectivity in polishing W/Dielectric films obtained using W Composition containing colloidal silica based solid state catalyst.

The W CMP polishing compositions containing either PS—SO$_3$H based solid state catalyst (I or II) or PS—COOH based solid state catalyst (I or II) gave similar NU % as the NU % obtained using W Composition containing colloidal silica based solid state catalyst.

The existence of the sulfonic acid or carboxylic acid functional groups on the organic latex polymer particle surfaces allows the coating of the ferric oxide or other ferric compounds onto the surface of the organic polymer particles to form soft solid state catalyst in the tungsten CMP polishing compositions.

The test results in Table 1 were summarizing below.

When the colloidal silica particle based iron compound catalyst was replaced by the organic polymer based iron compound catalysts, W film removal rates were unchanged or most time were increased while TEOS removal rates were reduced and thus W: TEOS selectivity was increased from 16:1 to the range of more than 50:1 (such as 55:1) to 90:1 (such as 95:1). The NU % performance was maintained.

Example 2

The Inductively Coupled Plasma Mass Spectroscopy (ICP-MS) analysis was conducted on the polished tungsten wafers to compare the iron contamination level of the reference and working W CMP compositions.

The results were listed in Table 2.

TABLE 2

Iron Contamination Concentration Comparison on Polished TEOS Wafers

| Sample | Fe ion concentration |
|---|---|
| Reference composition colloidal silica based solid state catalyst | 38000E9 atoms/sq. cm |
| Working Composition PS—SO$_3$H based solid state catalyst (I) | 26000E9 atoms/sq. cm |

As the results shown in Table 2, the W CMP polishing compositions containing PS—SO$_3$H based solid state catalyst gave relative low Fe ion contamination level than W Composition containing colloidal silica based solid state catalyst.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A tungsten chemical mechanical polishing (CMP) composition comprising:
   a) nano-sized abrasive;
   b) metal compounds coated on colloidal organic polymer particle surfaces as solid catalyst;
   c) oxidizer;
   d) corrosion inhibitor;
   e) water soluble liquid carrier; and
      optionally
   f) biocide when pH of the composition is between 5.0 to 8.0;
   g) pH adjusting agent;
   h) surfactant; and
   pH of the CMP composition is from 2.5 to 8;
   wherein
   the nano-sized abrasive is selected from the group consisting of colloidal silica with narrow or broad particle size distributions, with various sizes and with various shapes, the various shapes of the abrasives include spherical shape, cocoon shape, aggregate shape and other shapes, the colloidal silica particles doped by other metal oxide within lattice of the colloidal silica, such as alumina doped silica particles, colloidal aluminum oxide, which include alpha-, beta-, and gamma-types of aluminum oxides, colloidal and photoactive titanium dioxide, cerium oxide, colloidal cerium oxide, nano-sized diamond particles, nano-sized silicon nitride particles, mono-modal, bi-modal, multi-modal colloidal abrasive particles, zirconium oxide, organic polymer-based soft abrasives, and combinations thereof;
   the metal compounds in the metal compounds coated organic polymer particles are selected from the group consisting of iron compounds, copper compounds, silver compound, cobalt compounds, nickel compounds, and combinations thereof; and
   the organic polymer particles in the metal compound coated organic polymer particles are selected from the group consisting of organic polystyrene sulfonate (PS—SO$_3$H) beads, organic polystyrene carboxylate (PS—COOH) beads, organic polystyrene phosphate (PS—PO$_4^-$) beads, and combinations thereof.

2. The composition of claim 1, wherein the concentration of the nano-sized abrasive is from 0.1 wt. % to 5.0 wt. %.

3. The composition of claim 1, wherein the concentration of the metal compound coated organic polymer particles as solid state catalyst is from 0.05 wt. % to 1.0 wt. %.

4. The composition of claim 1, wherein the oxidizer is selected from the group consisting of periodic acid, hydrogen peroxide, potassium iodate, potassium permanganate, ammonium persulfate, ammonium molybdate, ferric nitrate, nitric acid, potassium nitrate, and combinations thereof; the preferred oxidizer is hydrogen peroxide; and concentration of the oxidizer is from 0.5 wt. % to 5.0 wt.

5. The composition of claim 1, wherein the corrosion inhibitor is selected from the group consisting of piperazine and its derivatives, linear or branched polyethylemine, organic polymeric or oligomeric primary and secondary amines, and combinations thereof; the preferred corrosion inhibitor is linear or branched polyethylemine, and concentration of the corrosion inhibitor is from 0.00005 wt. % to 0.10 wt. %.

6. The composition of claim 1, wherein composition comprises at least one of:
the biocide has active ingredient consisting of 5-chloro-2-methyl-4-isothiazolin-3-one, 2-methyl-4-isothiazolin-3-one, and combinations thereof; and concentration of the biocide is from 0.0005 wt. % to 0.025 wt. %;
the pH adjusting agent is selected from the group consisting of nitric acid, hydrochloric acid, sulfuric acid, phosphoric acid, and mixtures thereof for acidic pH conditions; or selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions; and concentration of the pH adjusting agent is from 0.01 wt. % to 0.5 wt. %;
the surfactant is selected from the group consisting of non-ionic, anionic, cationic, amphoteric surfactant, and combinations thereof; and concentration of the surfactant is from 0.001 wt. % to 0.1 wt. %.

7. The composition of claim 1, wherein the composition comprises colloidal silica particles having at least one size; iron coated particles selected from the group consisting of polystyrene sulfonate (PS—SO$_3$H) particles, organic polystyrene carboxylate (PS—COOH) particles, polystyrene phosphate (PS—PO$_4$) particles, and combinations thereof; polyethyleneimine; H$_2$O$_2$; and the pH is from 3 to 6.

8. A method of selective chemical mechanical polishing comprising steps of:
1) providing a semiconductor substrate having a surface containing tungsten and at least one dielectric material selected from the group consisting of dielectric material;
2) providing a polishing pad;
3) providing the chemical mechanical polishing composition comprising:
    a) nano-sized abrasive;
    b) metal compounds coated on colloidal organic polymer particle surfaces as solid catalyst;
    c) oxidizer;
    d) corrosion inhibitor;
    e) water soluble liquid carrier; and
    i. optionally f) biocide when pH of the composition is between 5.0 to 8.0;
g) pH adjusting agent;
h) surfactant; and
pH of the CMP composition is from 2.5 to 8;
wherein
the nano-sized abrasive is selected from the group consisting of colloidal silica with narrow or broad particle size distributions, with various sizes and with various shapes, the various shapes of the abrasives include spherical shape, cocoon shape, aggregate shape and other shapes, the colloidal silica particles doped by other metal oxide within lattice of the colloidal silica, such as alumina doped silica particles, colloidal aluminum oxide, which include alpha-, beta-, and gamma-types of aluminum oxides, colloidal and photoactive titanium dioxide, cerium oxide, colloidal cerium oxide, nano-sized diamond particles, nano-sized silicon nitride particles, monomodal, bi-modal, multi-modal colloidal abrasive particles, zirconium oxide, organic polymer-based soft abrasives, and combinations thereof; and
the metal compounds in the metal compounds coated organic polymer particles are selected from the group consisting of iron compounds, copper compounds, silver compound, cobalt compounds, nickel compounds, and combinations thereof; and the organic polymer particles in the metal compound coated organic polymer particles are selected from the group consisting of organic polystyrene sulfonate (PS—SO$_3$H) beads, organic polystyrene carboxylate (PS—COOH) beads, organic polystyrene phosphate (PS—PO$_4^-$), and combinations thereof;
4) contacting the surface of the semiconductor substrate with the polishing pad and the chemical mechanical polishing composition; and
5) polishing the surface of the semiconductor;
wherein at least a portion of the surface containing tungsten is in contact with both the polishing pad and the chemical mechanical polishing composition; and ratio of removal rate of tungsten to removal rate of the at least one dielectric material is equal or greater than 50:1.

9. The method of claim 8, wherein the concentration of the nano-sized abrasive is from 0.1 wt % to 5.0 wt. %; and the concentration of the metal compound coated organic polymer particles as solid state catalyst is from 0.05 wt. % to 1.0.

10. The method of claim 8, wherein the oxidizer is selected from the group consisting of periodic acid, hydrogen peroxide, potassium iodate, potassium permanganate, ammonium persulfate, ammonium molybdate, ferric nitrate, nitric acid, potassium nitrate, and combinations thereof; the preferred oxidizer is hydrogen peroxide; and concentration of the oxidizer is from 0.5 wt. % to 5.0 wt. %.

11. The method of claim 8, wherein the corrosion inhibitor is selected from the group consisting of piperazine and its derivatives, linear or branched polyethylemine, organic polymeric or oligomeric primary and secondary amines, and combinations thereof; the preferred corrosion inhibitor is linear or branched polyethylemine, and concentration of the corrosion inhibitor is from 0.00005 wt. % to 0.10 wt. %.

12. The method of claim 8, wherein composition comprises at least one of:
the biocide has active ingredient consisting of 5-chloro-2-methyl-4-isothiazolin-3-one, 2-methyl-4-isothiazolin-3-one, and combinations thereof; and concentration of the biocide is from 0.0005 wt. % to 0.025 wt. %;

the pH adjusting agent is selected from the group consisting of nitric acid, hydrochloric acid, sulfuric acid, phosphoric acid, and mixtures thereof for acidic pH conditions; or selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions; and concentration of the pH adjusting agent is from 0.01 wt. % to 0.5 wt. %; and the surfactant is selected from the group consisting of non-ionic, anionic, cationic, amphoteric surfactant, and combinations thereof; and concentration of the surfactant is from 0.001 wt. % to 0.1 wt. %.

13. The method of claim 8, wherein the composition comprises colloidal silica particles having at least one size; iron coated particles selected from the group consisting of polystyrene sulfonate (PS—$SO_3H$) particles, organic polystyrene carboxylate (PS—COOH) particles, polystyrene phosphate (PS—$PO_4$) particles, and combinations thereof; polyethyleneimine; $H_2O_2$; and the pH is from 3 to 6.

14. The method of claim 13, wherein the ratio of removal rate of tungsten to removal rate of the at least one dielectric material is equal or greater than 90:1.

15. A system of chemical mechanical polishing comprising:
1) providing a semiconductor substrate having a surface containing tungsten and at least one dielectric material;
2) providing a polishing pad;
3) providing the chemical mechanical polishing composition comprising:
   a) nano-sized abrasive;
   b) metal compounds coated on colloidal organic polymer particle surfaces as solid catalyst;
   c) oxidizer;
   d) corrosion inhibitor;
   e) water soluble liquid carrier; and
   optionally
   f) biocide when pH of the composition is between 5.0 to 8.0;
   g) pH adjusting agent;
   h) surfactant; and
   pH of the CMP composition is from 2.5 to 8;
   wherein
   the nano-sized abrasive is selected from the group consisting of colloidal silica with narrow or broad particle size distributions, with various sizes and with various shapes, the various shapes of the abrasives include spherical shape, cocoon shape, aggregate shape and other shapes, the colloidal silica particles doped by other metal oxide within lattice of the colloidal silica, such as alumina doped silica particles, colloidal aluminum oxide, which include alpha-, beta-, and gamma-types of aluminum oxides, colloidal and photoactive titanium dioxide, cerium oxide, colloidal cerium oxide, nano-sized diamond particles, nano-sized silicon nitride particles, mono-modal, bi-modal, multi-modal colloidal abrasive particles, zirconium oxide, organic polymer-based soft abrasives, and combinations thereof; and
   the metal compounds in the metal compounds coated organic polymer particles are selected from the group consisting of iron compounds, copper compounds, silver compound, cobalt compounds, nickel compounds, and combinations thereof; and
   the organic polymer particles in the metal compound coated organic polymer particles are selected from the group consisting of organic polystyrene sulfonate (PS—$SO_3H$) beads, organic polystyrene carboxylate (PS—COOH) beads, organic polystyrene phosphate (PS—$PO_4^-$), and combinations thereof;
4) contacting the surface of the semiconductor substrate with the polishing pad and the chemical mechanical polishing composition; and
5) polishing the surface of the semiconductor substrate; wherein at least a portion of the surface containing tungsten is in contact with both the polishing pad and the chemical mechanical polishing composition.

16. The system of claim 15, wherein the concentration of the nano-sized abrasive is from 0.1 wt. % to 5.0 wt. %; and the concentration of the metal compound coated organic polymer particles as solid state catalyst is from 0.05 wt. % to 1.0.

17. The system of claim 15, wherein the oxidizer is selected from the group consisting of periodic acid, hydrogen peroxide, potassium iodate, potassium permanganate, ammonium persulfate, ammonium molybdate, ferric nitrate, nitric acid, potassium nitrate, and combinations thereof; the preferred oxidizer is hydrogen peroxide; and concentration of the oxidizer is from 0.5 wt. % to 5.0 wt. %.

18. The system of claim 15, wherein the corrosion inhibitor is selected from the group consisting of piperazine and its derivatives, linear or branched polyethylemine, organic polymeric or oligomeric primary and secondary amines, and combinations thereof; the preferred corrosion inhibitor is linear or branched polyethylemine, and concentration of the corrosion inhibitor is from 0.00005 wt. % to 0.10 wt. %.

19. The system of claim 15, wherein composition comprises at least one of:
the biocide has active ingredient consisting of 5-chloro-2-methyl-4-isothiazolin-3-one, 2-methyl-4-isothiazolin-3-one, and combinations thereof; and concentration of the biocide is from 0.0005 wt. % to 0.025 wt. %;

the pH adjusting agent is selected from the group consisting of nitric acid, hydrochloric acid, sulfuric acid, phosphoric acid, and mixtures thereof for acidic pH conditions; or selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions; and concentration of the pH adjusting agent is from 0.01 wt. % to 0.5 wt. %; and the surfactant is selected from the group consisting of non-ionic, anionic, cationic, amphoteric surfactant, and combinations thereof; and concentration of the surfactant is from 0.001 wt. % to 0.1 wt. %.

20. The system of claim 15, wherein the composition comprises colloidal silica particles having at least one size; iron coated particles selected from the group consisting of polystyrene sulfonate (PS—$SO_3H$) particles, organic polystyrene carboxylate (PS—COOH) particles, polystyrene phosphate (PS—$PO_4$) particles, and combinations thereof; polyethyleneimine; $H_2O_2$; and the pH is from 3 to 6.

* * * * *